US008537596B2

(12) United States Patent
Ordentlich et al.

(10) Patent No.: US 8,537,596 B2
(45) Date of Patent: Sep. 17, 2013

(54) OVERWRITING A MEMORY ARRAY

(75) Inventors: Erik Ordentlich, San Jose, CA (US); Ron M. Roth, Haifa (IL); Gadiel Seroussi, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/278,882

(22) Filed: Oct. 21, 2011

(65) Prior Publication Data

US 2013/0100727 A1 Apr. 25, 2013

(51) Int. Cl.
*G11C 11/00* (2006.01)

(52) U.S. Cl.
USPC .......... 365/148

(58) Field of Classification Search
USPC .......... 365/148
See application file for complete search history.

(56) References Cited

U.S. PATENT DOCUMENTS 7,746,704 B1 * 6/2010 Tang et al. .......... 365/185.28
7,839,671 B2 11/2010 Taguchi
7,863,598 B2 1/2011 Sugita et al.
7,978,501 B2 7/2011 Chevallier et al.
7,982,504 B1 7/2011 Robinett
2009/0272958 A1 11/2009 Ufert et al.
2010/0259960 A1 * 10/2010 Samachisa .......... 365/148
2011/0007545 A1 1/2011 Jin et al.

* cited by examiner

*Primary Examiner* — Hoai V Ho
*Assistant Examiner* — Jay Radke

(57) ABSTRACT

A data storage system including a memory array including a plurality of memory devices programmable in greater than two states. A read/write control module may overwrite data in the memory array without violating a constraint during the overwrite process. The memory array may be an m×n memory array.

19 Claims, 8 Drawing Sheets

300

READ $m$ x $n$ MEMORY ARRAY A″
301

FOR $i$ = 1 to m, AND FOR $j$ = 1 to n, IF $A_{i,j} < A''_{i,j}$, STORE $A_{i,j}$ IN THE RESISTIVE MEMORY DEVICE AT LOCATION ($i$, $j$), OVERWRITING $A''_{i,j}$
302

FOR $i$ = 1 to m, AND FOR $j$ = 1 to n, IF $A_{i,j} > A''_{i,j}$, STORE $A_{i,j}$ IN THE RESISTIVE MEMORY DEVICE AT LOCATION ($i$, $j$), OVERWRITING $A''_{i,j}$
303

131

| | 1 | 2 | 3 | 4 | 5 |
|---|---|---|---|---|---|
| 1 | 0 | 0 | 1 | 3 | 3 |
| 2 | 0 | 0 | 1 | 3 | 3 |
| 3 | 3 | 3 | 1 | 0 | 0 |
| 4 | 3 | 3 | 1 | 0 | 0 |
| 5 | 1 | 1 | 1 | 1 | 1 |

| | 1 | 2 | 3 | 4 | 5 |
|---|---|---|---|---|---|
| 1 | 1 | 1 | 1 | 1 | 1 |
| 2 | 1 | 1 | 1 | 1 | 1 |
| 3 | 1 | 1 | 1 | 1 | 1 |
| 4 | 1 | 1 | 1 | 1 | 1 |
| 5 | 1 | 1 | 1 | 1 | 1 |

FIG. 5B

| | 1 | 2 | 3 | 4 | 5 |
|---|---|---|---|---|---|
| 1 | 1 | 0 | 1 | 3 | 3 |
| 2 | 0 | 0 | 1 | 3 | 3 |
| 3 | 3 | 3 | 1 | 0 | 0 |
| 4 | 3 | 3 | 1 | 0 | 0 |
| 5 | 1 | 1 | 1 | 1 | 1 |

134

| | 1 | 2 | 3 | 4 | 5 |
|---|---|---|---|---|---|
| 1 | 0 | 0 | 1 | 1 | 1 |
| 2 | 0 | 0 | 1 | 1 | 1 |
| 3 | 1 | 1 | 1 | 0 | 0 |
| 4 | 1 | 1 | 1 | 0 | 0 |
| 5 | 1 | 1 | 1 | 1 | 1 |

OVERWRITING A MEMORY ARRAY

BACKGROUND

Memories may be based on resistive switching devices, such as, for example, memristors, which may be arranged in a crossbar architecture. A crossbar architecture may include, for example, a crossbar array including a plurality of memristors in each row and column. The number of memristors in any row or column that are in low resistance states can impact the performance of the memories. In order to program or read the value of a memristor, a respective write or read voltage may be applied to the memristor through the respective row and column wires of the selected memristor. However, other memristors connected to the same row and column wires of the selected memristor may also experience voltage drop across their terminals and may thus be considered half-selected. Such half-selected memristors that are in a low resistance state may also contribute to cumulative current draw. The cumulative current draw can lead, for example, to power wastage and inaccuracies in determination of the state of the selected memristor. The cumulative current draw can also lead, for example, to parasitic loss that can limit the crossbar array size. The foregoing aspects can affect initial writing of a crossbar array, as well as overwriting of the crossbar array from an initial state to a target state.

BRIEF DESCRIPTION OF DRAWINGS

The embodiments are described with reference to the following figures:

FIGS. 5A-5E illustrate examples of the processing of bits for a memristor during an overwriting process, according to an embodiment.

DETAILED DESCRIPTION OF EMBODIMENTS

Figure 1:
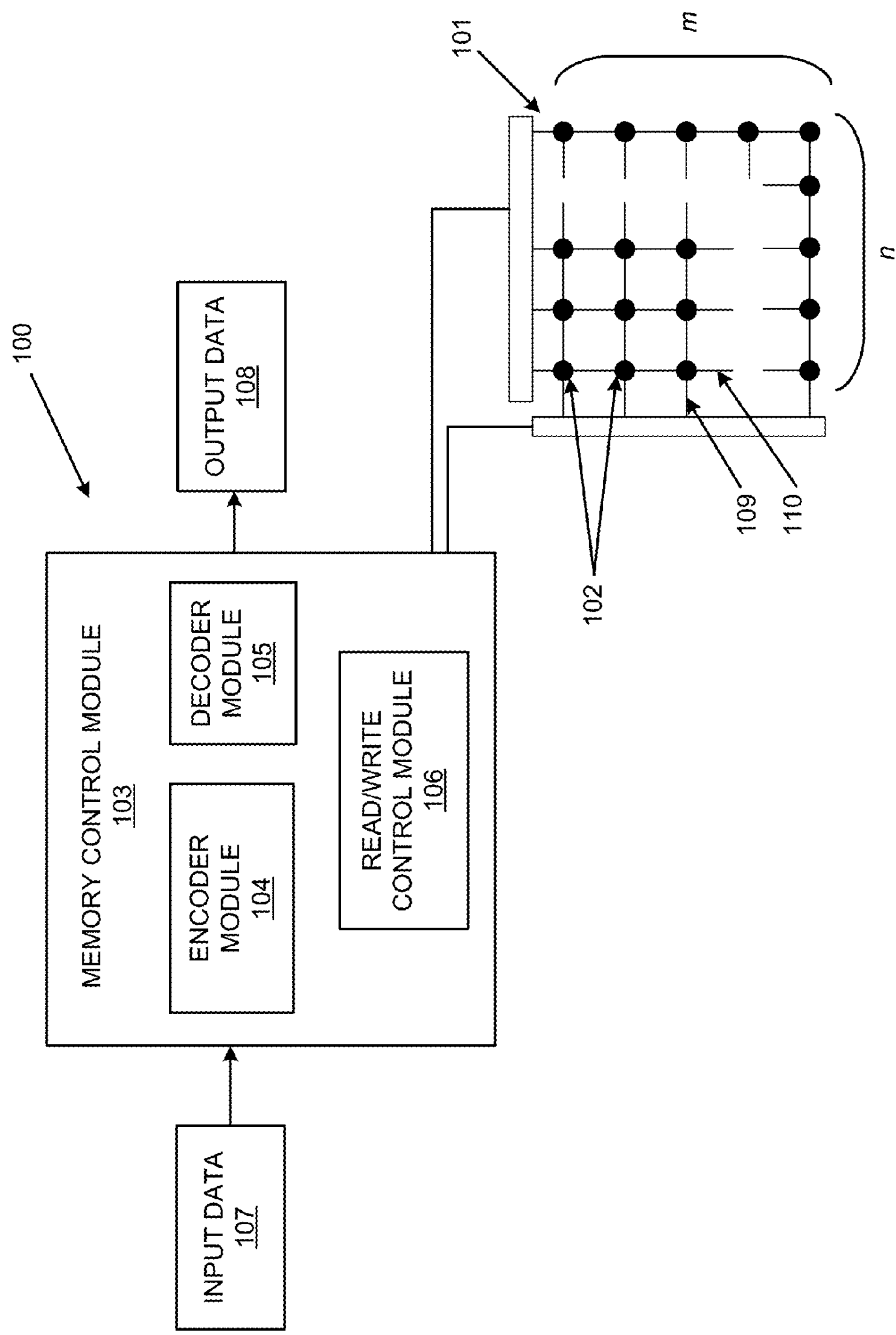
FIG. 1 illustrates a schematic view of a data storage system including a crossbar array of resistive switching devices, such as, for example, memristors, according to an embodiment.

For simplicity and illustrative purposes, the principles of the embodiments are described by referring mainly to examples thereof. In the following description, numerous specific details are set forth in order to provide a thorough understanding of the embodiments. It will be apparent that the embodiments may be practiced without limitation to all the specific details. Also, the embodiments may be used together in various combinations.

1. Overview

For memories based on resistive switching devices, such as, for example, memristors, the number of such resistive switching devices placed in low resistance states may impact the memory performance. For example, a memory may include a crossbar array including a plurality of memristors in each row and column of the array. In order to program or read the value of a memristor, a respective write or read voltage may be applied to the memristor through the respective row and column wires of the selected memristor. However, other memristors connected to the same row and column wires of the selected memristor may also experience voltage drop across their terminals and may thus be considered half-selected. Such half-selected memristors that are in a low resistance state may also contribute to cumulative current draw. The memory performance for such crossbar arrays may be increased by limiting the number of memristors placed in a low resistance state. The foregoing aspects may affect initial writing of a crossbar array, as well as overwriting of the crossbar array from an initial state to a target state.

A data storage system is provided and may include a memory array including a plurality of memory devices programmable in greater than two states. For example, the memory devices may be programmable in greater than two resistance states. For example, the memory devices may be programmable in two resistance states (e.g., high and low resistance), or greater than two resistance states (i.e., multi-level resistance)). More generally, the memory devices may be programmable in greater than two states associated with a physical magnitude of a memory device. A read/write control module may overwrite data in the memory array without violating a constraint during the overwrite process.

For the data storage system described above, the memory array may be an m×n memory array. As described in detail below, the constraint may include a set of constraints that are specified such that an amount of current leaking through half-selected memory devices in a selected row and a selected column of the m×n memory array is, respectively, less than or equal to nC/2 and mC/2, where C is the largest sum of half-selected device current magnitudes for pairs of complementary states. For example, C is the largest sum of half-selected device current magnitudes for pairs of complementary states of a half-selected device among a set of possible pairs of complementary states. For example, as discussed in further detail below, h and s−1−h are defined as complementary state pairs, where s is a number of states of a memory device (i.e., resistance states for a memory device programmable in different resistance states), and h is a dummy variable. The read/write control module may determine if a target entry (e.g., a data value $A_{i,j}$ corresponding to the resistance or conductance state desired to be written to a selected memory device located at position (i, j) of memory array A) of the memory array is less than a corresponding initial entry (e.g., an initial data value $A''_{i,j}$ corresponding to the initial resistance or conductance state currently being stored in the selected memory device) of the memory array, and based on the determination, the read/write control module may overwrite data in the memory array. For example, for i=1 to m, and for j=1 to n, the read/write control module may determine if $A_{i,j}<A''_{i,j}$, and based on the determination, the read/write control module may store $A_{i,j}$ in a respective memory device at location (i, j), overwriting $A''_{i,j}$, where $A_{i,j}$ and $A''_{i,j}$ respectively denote target and initial entries (e.g., data values corresponding to the resistance or conductance state) of the memory device at position (i, j) of the m×n memory array. The read/write control module may determine if a target entry in the memory array is greater than a corresponding initial entry of the memory array, and based on the determination, the read/write control module may overwrite data in the memory array. For example, for i=1 to m, and for j=1 to n, the read/write control module may determine if $A_{i,j}>A''_{i,j}$, and based on the determination, the read/write control module may store $A_{i,j}$ in a respective memory device at location (i, j), overwriting $A''_{i,j}$.

As also described in detail below, a method for overwriting a memory array including a plurality of memory devices is provided and may include programming the memory devices in greater than two states (e.g., resistance states or states related to physical magnitude), and overwriting data in the memory array without violating a constraint during the overwrite process.

For the method, the memory array may be an m×n memory array. The constraint may include a set of constraints that are specified such that an amount of current leaking through half-selected memory devices in a selected row and a selected column of the m×n memory array is, respectively, less than or equal to nC/2 and mC/2, where C is the largest sum of half-selected device current magnitudes for pairs of complementary states. For example, C is the largest sum of half-selected device current magnitudes for pairs of complementary states of a half-selected device among a set of possible pairs of complementary states. The method may include determining if the data value for a target entry of the memory array is less than a corresponding data value for the initial entry of the memory array, and based on the determination, overwriting data in the memory array. For example, for i=1 to m, and for j=1 to n, the method may further include determining if $A_{i,j}<A''_{i,j}$, and based on the determination, storing the resistance state corresponding to $A_{i,j}$ in a respective memory device at location (i, j), overwriting the resistance state corresponding to $A''_{i,j}$, where $A_{i,j}$ and $A''_{i,j}$ respectively denote the data values corresponding to the target and initial resistance states of the memory device at position (i, j) of the m×n memory array. The method may include determining if the data value corresponding to the target entry in the memory array is greater than the data value of the corresponding initial entry of the memory array, and based on the determination, overwriting resistance states in the memory array. For example, for i=1 to m, and for j=1 to n, the method may further include determining if $A_{i,j}>A''_{i,j}$, and based on the determination, storing the resistance state corresponding to the data value $A_{i,j}$ in the respective memory device at location (i, j), overwriting the resistance state corresponding to the data value $A''_{i,j}$.

As also described in detail below, a non-transitory computer readable medium storing machine readable instructions is provided. The machine readable instructions when executed by a computer system may perform a method for overwriting a memory array including a plurality of memory devices. The method may include programming the memory devices in greater than two states (e.g., resistance states or states related to physical magnitude), and overwriting data in the memory array without violating a constraint during the overwrite process.

Based on the foregoing, the memory performance for such crossbar arrays including resistive memory devices programmed to be in one of a number of resistance states may be increased, for example, by limiting the number of memory devices placed in a low resistance state. Examples of increased memory performance may include a reduction in the cumulative current draw, which may provide for reduced power consumption and increased accuracy in determination of the state of a selected memory device. Reduction in the cumulative current draw may also lead, for example, to reduction in parasitic loss, which may thus provide for increase in a crossbar array size.

Although the discussion herein is related to resistive memory devices, the concepts may be applied to memory devices programmable in different resistance states or states related to physical magnitude of a memory device generally. For example, for any memory organized in rows and columns or by another method, where each memory cell can be in one of a set of states, each state may be associated with a physical magnitude. The concepts herein may be applied to limiting the sum of the magnitudes in each row and column. For example, in flash memory, states of memory cells may be associated with charge magnitudes, and the concepts described herein may be applied to limiting the sum of the charges of a row or column.

2. Structure and Method

FIG. 1 illustrates a schematic view of a data storage system 100 including an m×n memory array 101 of resistive memory devices 102, such as, for example, memristors, according to an embodiment. The system 100 may include a memory control module 103 to control operations of storing and retrieving data to and from the m×n memory array 101. An encoder module 104 may provide for data encoding, and a decoder module 105 may provide for data decoding. A read/write control module 106 may control operations of reading data from the memory array 101 and writing data to the memory array. The memory control module 103 may encode input data 107, and store the encoded data into the memory array 101. The memory control module 103 may also read out the encoded data stored in the memory array 101, decode the data to recover the original bits in the input data 107, and transmit the decoded data as output data 108.

Referring to FIG. 1, the m×n memory array 101 may respectively include first and second sets of m and n conductors. Each of the m conductors in the first set may intersect with each of the n conductors in the second set to address one of the memory devices 102 located at the intersection. In order to facilitate a description of the memory array 101, the conductors in the first and second sets may be respectively referred to as row and column conductors. The m×n memory array 101 may include m row wire segments 109 and n column wire segments 110 in a circuit plane. The intersections of the row and column wire segments may form a total of m×n memory devices. The conductors and memory devices may be formed in different circuit planes. Moreover, the conductors may be formed of a variety of shapes as needed, and may likewise form a grid of a variety of shapes.

The resistive memory devices 102 (e.g., memristors) may be programmed to be in one of a number s resistance states such that at the half-select voltage, the maximum current magnitudes passing through the memory devices in each of these respective states may be denoted $c_0, c_1, \ldots c_{s-1}$, where $c_0<c_1<\ldots<c_{s-1}$ and $c_h+c_{s-1-h}\leqq c_0+c_{s-1}=C$ for each h. C may be defined as the largest sum of half-selected device current magnitudes for pairs of complementary states. For example, C is the largest sum of half-selected device current magnitudes for pairs of complementary states of a half-selected device among a set of possible pairs of complementary states. For example, h and s−1−h are defined as a pair of complementary states or as a complementary state pair, where s is a number of resistance states of a memory device, and h is a dummy variable. Thus C may be defined as the maximum of $c_h+c_{s-1-h}$ over the range of h, that is, the maximum sum of half select-current magnitudes between states that can be flipped to each other. C will in general be greater than the maximum half-select current magnitude, which is $c_{s-1}$. The maximum of $c_h+c_{s-1-h}$ may be attained, for example, at h=0, or may also be otherwise specified. The aggregate state of the resistive memory devices 102 may be represented in a m×n crossbar, for example, as the m×n memory array 101 over the alphabet $\{0, 1, \ldots, s-1\}$. An array entry having the value h may indicate that the resistive memory device 102 at the corresponding location in the crossbar is in a resistance state leading to half-select current $c_h$. The half-select current may be denoted using the functional notation $c(h)=c_h$. Array entries may be referred to using their row and column indices.

For example, the entry in row i and column j may be referred to using the ordered pair (i, j). Given an array A, the notation $A_{i,j}$ may denote entry (i, j) of the array.

For a number x let $\lfloor x \rfloor$ denote the greatest integer less than or equal to x. Given m and n, length $\lfloor (m-1)(n-1)\log_2 s+(m+n-1)\log_2\lfloor s/2 \rfloor \rfloor$ strings of unconstrained bits of the input data 107 may be encoded and decoded to and from the m×n arrays 101 over the alphabet $\{0, 1, \ldots, s-1\}$ which satisfy the following constraints, respectively, for each i, and for each j:

$$\frac{1}{n}\sum_{j=1}^{n} c(A_{i,j}) \le \frac{C}{2} \quad (1)$$

$$\frac{1}{m}\sum_{i=1}^{m} c(A_{i,j}) \le \frac{C}{2} \quad (2)$$

If s=2 (i.e., the binary case), these constraints reduce to the constraint discussed in detail in co-pending PCT Patent Application Serial No. PCT/US2010/040321, filed Jun. 29, 2010. For example, for s=2, each row and column of the encoded array may respectively contain no more than n/2 and m/2 1's. For s resistance states generally, if the writing procedure involves putting 0 volts on the conductors of unselected resistive memory devices 102 and the full-select voltage across the conductors of the selected memory devices, these constraints may ensure that the amount of current leaking through the half-selected memory devices in the selected row and column is, respectively, at most nC/2 and mC/2 as opposed to, for example, $(n-1)c_{s-1}$ and $(m-1)c_{s-1}$ without the constraint. Among the assumed states of the resistive memory devices 102, $c_{s-1}$ may be the maximum half-select current and $C/2=(c_0+c_{s-1})/2$ may be approximately $c_{s-1}/2$ assuming a very small value of $c_0$. Thus the maximum leakage current may be reduced by a factor of approximately one-half.

Figure 2:
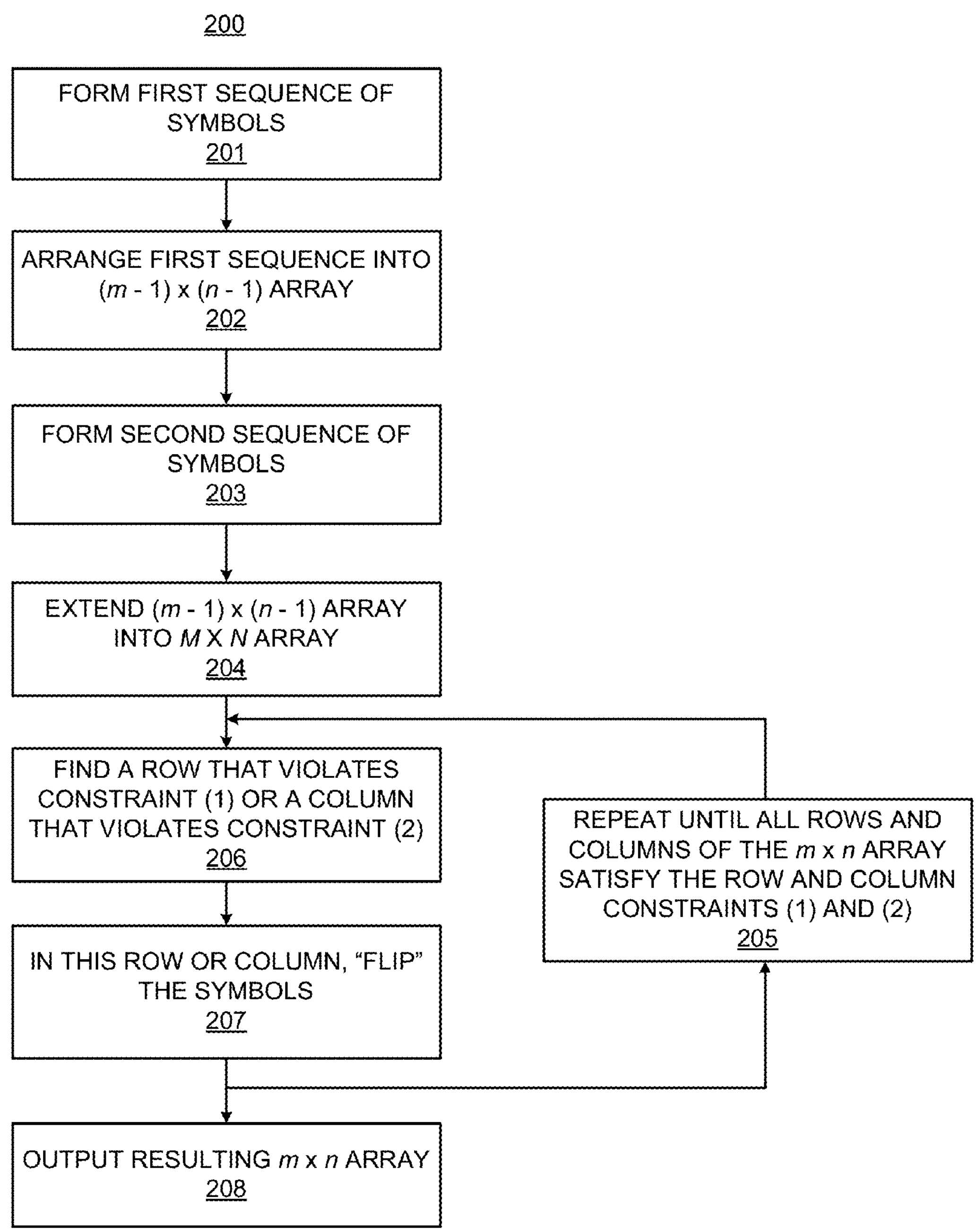
FIG. 2 illustrates a method of encoding, according to an embodiment.

FIG. 2 illustrates a method of encoding 200 using the encoder module 104 of FIG. 1, according to an embodiment. The method of encoding is described in conjunction with the operation of the data storage system 100.

Referring to FIG. 1, the number of bits of the input data 107 to be encoded may be denoted as R, wherein R is as follows:

$$R=\lfloor (m-1)(n-1)\log_2 s+(m+n-1)\log_2\lfloor s/2 \rfloor \rfloor \quad (3)$$

The first term in the integer "floor" operation of R is approximately a number of bits of R that may be encoded to and decoded from a sequence of (m−1)(n−1) symbols over the alphabet $\{0, 1, \ldots, s-1\}$. If s is a power of 2, then this approximation is exact. The second term inside the integer "floor" operation of R is approximately another number of bits of R that may be encoded to and decoded from another sequence of m+n−1 symbols over the alphabet $\{0, 1, \ldots \lfloor s/2 \rfloor -1\}$. Again, for s a power 2 this approximation is exact. For s=2 and s=3, the latter alphabet equates to $\{0\}$, and, therefore, having one symbol, the additional sequence carries no additional information and includes all 0's.

For $s=2^k$ for an integer k, the binary input bits may be encoded into the above sequences by partitioning the input bits into (m−1)(n−1) groups of k bits followed by (m+n−1) groups of k−1 bits, with the groups mapping onto the above alphabets using a binary representation.

For the number of resistance states (i.e., $s=2^k$) and the number of input bits to be encoded (i.e., R as denoted above), the encoder module 104 may perform the following operations. For an input of an arbitrary string of R bits denoted as u (i.e., the input data 107), the encoder module 104 may output an m×n array satisfying the constraints (1) and (2) specified above. Referring to FIGS. 1 and 2, in order to encode the input data 107, the encoder module 104 may proceed as follows.

At block 201, the encoder module 104 may form a first sequence of symbols over the alphabet $\{0, 1, \ldots, 2^k-1\}$ by grouping first (m−1)(n−1)k bits of u into (m−1)(n−1) groups of k bits with each such group, via a binary (or base 2) representation of integers, corresponding to a symbol in $\{0, 1, \ldots, 2^k-1\}$.

At block 202, the encoder module 104 may arrange the first sequence into an (m−1)×(n−1) array (e.g., first n−1 of symbols into first row, next n−1 symbols into second row, etc.).

At block 203, a second sequence of symbols may be formed over the alphabet $\{0, 1, \ldots, 2^{k-1}-1\}$ grouping the remaining (m+n−1)(k−1) input bits left over from block 201 into groups of k−1 bits with each group, again via a binary representation, corresponding to a symbol in $\{0, 1, \ldots, 2^{k-1}-1\}$.

At block 204, the encoder module 104 may extend the (m−1)×(n−1) array (formed at block 202) into an m×n array by filling in the m-th row and n-th column (total of m+n−1 elements) using the second sequence formed at block 203.

At block 205, the following encoding procedures at blocks 206 and 207 may be repeated until all rows and columns of the m×n array, respectively, satisfy the row and column constraints (1) and (2) specified above.

At block 206, the encoder module 104 may find a row that violates constraint (1) or a column that violates constraint (2). If no such row or column exists, the encoder module 104 may proceed to block 208.

At block 207, in this row or column, the encoder module 104 may "flip" the symbols by applying the mapping $f(h)=2^k-1-h$ to each symbol in the row or column. In the general case, the "flip" mapping may be $f(h)=s-1-h$, where s is the number of resistance states for a resistive memory device. For example, based on the binary representation with k=2, values of 0 (i.e., binary 00) may be flipped to 3 (i.e., binary 11), values of 1 (i.e., binary 01) may be flipped to 2 (i.e., binary 10), values of 2 (i.e., binary 10) may be flipped to 1 (i.e., binary 01), and values of 3 (i.e., binary 11) may be flipped to 0 (i.e. binary 00).

At block 208, based on the foregoing, the encoder module 104 may output the resulting m×n array as A. It is noted that the sequence of procedures specified above are provided as an example of the operation of the encoder module 104, and may be modified as needed.

The foregoing procedure of encoding the input data 107 is well defined in that the processing at blocks 205-207 will terminate. Since the selected row or column in each iteration of the processing at block 206 violates the corresponding constraint (1) or (2), if C' is the initial average of $c(A_{i,j})$ over the row or column, the average after the flipping process may be no more than C−C', and if C'>C/2 then C−C'<C' which means that the sum of $c(A_{i,j})$ over the entire array has decreased. Thus the foregoing procedure reaches a point where no row or column violating the constraint is found and the resulting array satisfies the desired constraints.

For the iteration at blocks 205-207, many possible variations exist, such as, for example, a greedy procedure to flip the row or column which violates the constraint by the greatest margin. Alternatively, all constraint violating rows can be dealt with, followed by all constraint violating columns, and then rows, and so on.

In contrast to the binary case, for $s=2^k$ with $k \geqq 2$, the foregoing encoding procedure also stores information in the last row and column of the array. These entries store one fewer bit each than the entries in the upper-left (m−1)×(n−1) subarray.

The most significant bits of these entries may be initialized to 0 and record the effect of the flipping process on the array entries so that it can be inverted during decoding. Generally, any bit position of the symbol values in the boundary positions may be used (e.g., least significant, second most significant, etc). Moreover, other positions in the array besides the last row and column may also be used for this purpose.

Figure 3:
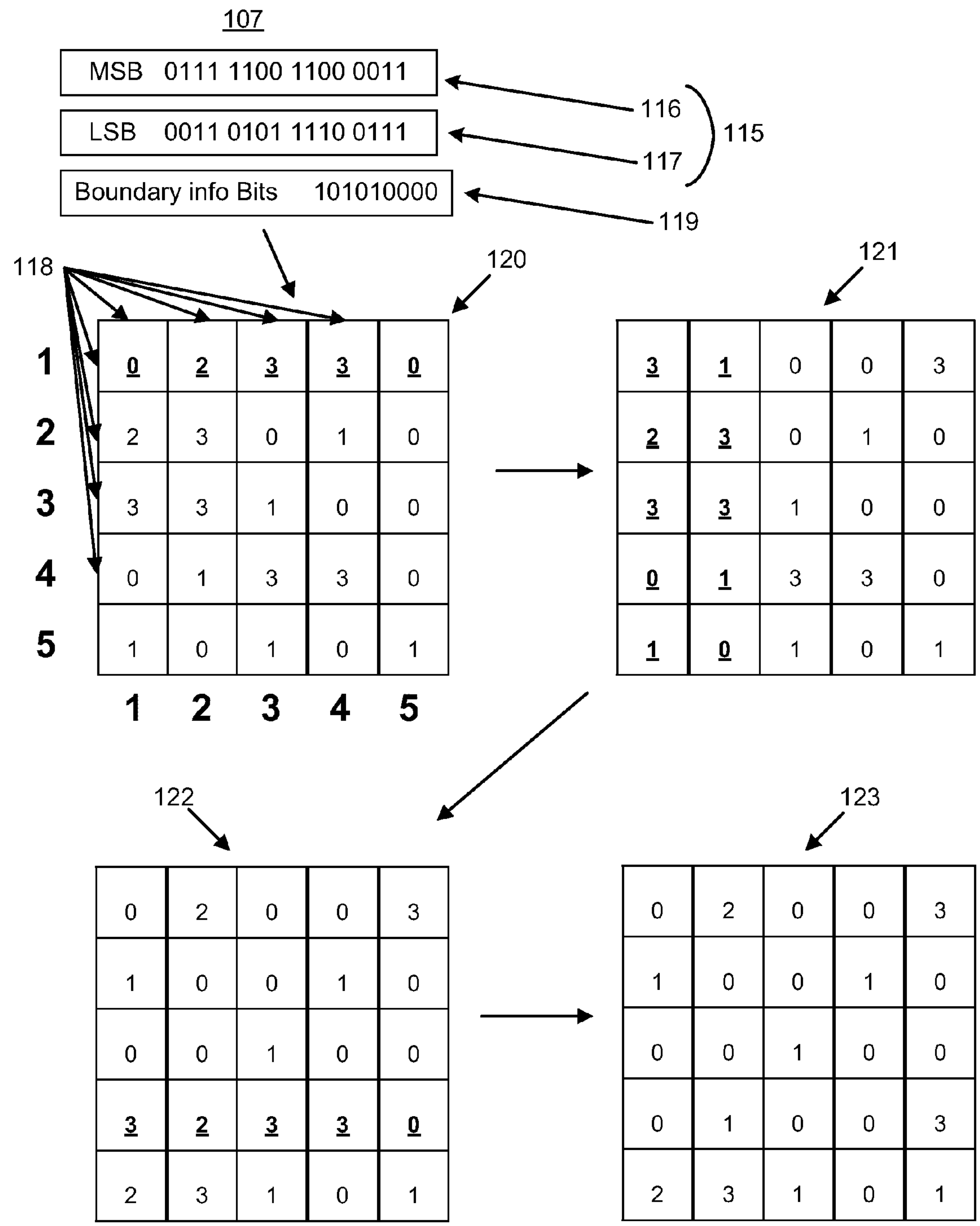
FIG. 3 illustrates an example of the processing of bits for a memristor during an encoding process, according to an embodiment.

Referring to FIG. 3, an example of the processing of the input data 107 by the encoder module 104 for four resistance states (i.e., s=4, k=2, and m=n=5) is described.

Referring to block 201 above (see FIG. 2), the input data 107 may be formed into a first sequence 115 of symbols including the most significant bit (MSB) values 116, and the least significant bit (LSB) values 117. The first sequence of symbols over the alphabet $\{0, 1, \ldots, 2^k-1\}$ may be formed by grouping first (m−1)(n−1)k bits of the input sequence u into (m−1)(n−1) groups of k bits with each such group, via the binary (or base 2) representation of integers, corresponding to a symbol in $\{0, 1, \ldots, 2^k-1\}$. Referring to block 202 above, the first sequence 115 may be arranged into an (m−1)×(n−1) array 118 (e.g., first n−1 of symbols into first row, next n−1 symbols into second row, etc.). For example, for array 118, the first n−1 symbols may include 0 2 3 3, the second n−1 symbols may include 2 3 0 1 etc. The value $A_{1,1}$ may be obtained based on the first values of the MSB=0 and LSB=0, thus the binary representation 00 equates to $A_{1,1}=0$. The value $A_{1,2}$ may be obtained based on the first values of the MSB=1 and LSB=0, thus the binary representation 10 equates to $A_{1,2}=2$. The remaining values of the array 118 may be similarly obtained. Referring to block 203 above, a second sequence 119 of symbols may be formed. The second sequence of symbols may be formed over the alphabet $\{0, 1, \ldots, 2^{k-1}-1\}$ grouping the remaining (m+n−1)(k−1) input bits left over from block 201 into groups of k−1 bits with each group, again via a binary representation, corresponding to a symbol in $\{0, 1, \ldots, 2^{k-1}-1\}$. The second sequence 119 may thus include the boundary info bits 101010000. Referring to block 204 above, the (m−1)×(n−1) array 118 may be extended into an m×n array 120 by filling in the m-th row and n-th column (total of m+n−1 elements) using the second sequence formed at block 203.

Referring to block 205 above, the processing at blocks 206 and 207 may be repeated until all rows and columns of the m×n array, respectively, satisfy the row and column constraints (1) and (2) specified above. For example, for block 206, the encoder 104 may find a row that violates constraint (1) or a column that violates constraint (2). If no such row or column exists, the encoder module 104 may proceed to block 208. For the m×n array 120, for s=4, constraints (1) and (2) may be specified such that C=3. In this regard, the implicit assumption is made that $c(A_{i,j})=A_{i,j}$. For example, for s=4, the right side of the inequality for constraint (1) may be 3/2. For constraints (1) and (2), with m=n=5 for the example of FIG. 3, the sum of the entries in every row and column may at most be 3/2×n (or m)=7.5. Rounding 7.5 to the lowest integer, the sum of the entries in every row and column may at most be 7.0. For the m×n array 120, row 1 violates this constraint in that the sum of the entries is 8. Thus for row 1, at block 207, the symbols may be flipped by applying the mapping $f(h)=2^k-1-h$ to each symbol in the row. In the general case, the "flip" mapping may be f (h)=s−1−h. For example, based on the binary representation, values of 0 may be flipped to 3, values of 1 may be flipped to 2, values of 2 may be flipped to 1, and values of 3 may be flipped to 0. Based on the foregoing, row 1 of the array 120 may be flipped as shown at array 121. For array 121, columns 1 and 2 violate the constraint in that the sum of the entries is 9 and 8, respectively. For columns 1 and 2, the symbols may be flipped by applying the mapping $f(h)=2^k-1-h$ to each symbol in the column. Based on the foregoing, columns 1 and 2 of the array 121 may be flipped as shown at array 122. For the array 122, row 4 violates this constraint in that the sum of the entries is 11. Row 4 of the array 122 may be flipped as shown at array 123, which satisfies both the constraints (1) and (2).

Decoding using the decoder module 105 is described in detail in co-pending U.S. patent application Ser. No. 13/277,837 filed Oct. 20, 2011.

Figure 4:
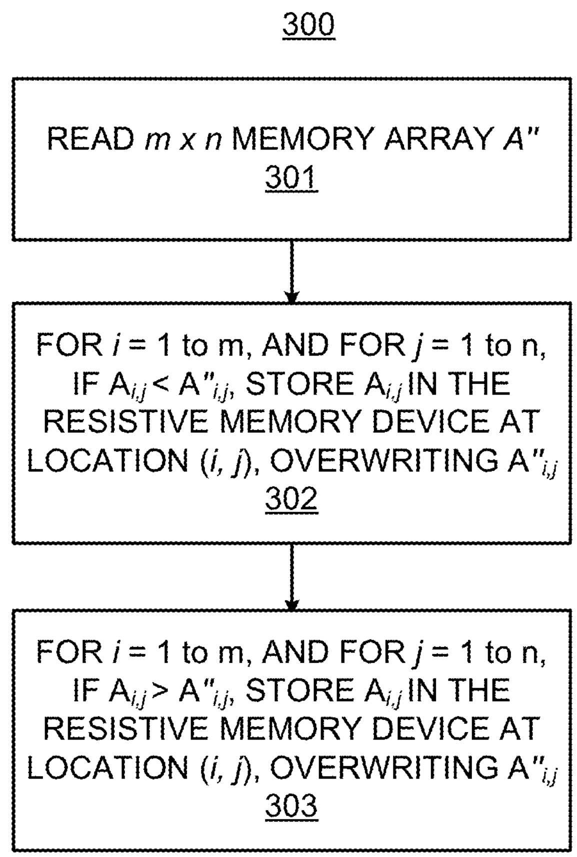
FIG. 4 illustrates a method of overwriting, according to an embodiment.

Next, overwriting of the m×n memory array 101 is described with reference to FIGS. 1 and 4. FIG. 4 illustrates a method of overwriting 300 using the read/write control module 106, according to an embodiment. The method of overwriting is described in conjunction with the operation of the data storage system 100.

One consideration in using the foregoing encoding method 200 to reduce half-select current leakage is to ensure that while a previously stored coded m×n memory array 101 is being overwritten with a new coded m×n memory array 101, the row-column constraints (1) and (2) continue to be met as each symbol of the new array is written. This ensures the prescribed limit on the half-select leakage current for each write. A writing method of the new array symbols following, for example, a raster scan across the rows from top to bottom can be shown to lead to constraint violations even if both the previously stored and new arrays are constraint satisfying.

In the binary case, this issue is described in detail in co-pending PCT Patent Application Serial No. PCT/US2010/043543, filed Jul. 28, 2010, where an efficient writing protocol that entails writing all of the 0's in the new array followed by writing all of the 1's, is disclosed. It can be shown that if this protocol is followed, all intermediate arrays are guaranteed to satisfy the row-column constraints.

For the non-binary case, one generalization of the binary protocol may be to first write all symbols in the new array having the lowest half-select current, that is those in positions (i, j) for which $A_{i,j}=0$, then those having the next lowest half-select current ($A_{i,j}=1$), and so on, up through those with the largest half-select current ($A_{i,j}=s-1$). While this protocol may likely be preferable over a "data blind" approach such as the raster scan, it still may lead to violations of the row-column constraints. For example, symbols corresponding to intermediate values of half-select current in the new array may overwrite symbols with lower half-select current in the old array, thereby leading to constraint violations, particularly if high half-select current resistive memory devices 102 in the old array have yet to be overwritten.

In order to address the foregoing aspects, generally, first a read may be carried to determine the previously stored, coded array. Then, those symbols in the new array for which the half-select current is smaller than or equal to the half-select currents of the corresponding symbols in the old array may be written, followed by the remaining symbols. This will ensure that for all writes, the half-select current leakage is smaller than it would be if all other symbols are as in either the new or old arrays, which, by design, are constraint satisfying.

Referring to FIG. 4, the foregoing method of overwriting 300 using the read/write control module 106 is described. For the method 300, let A" denote the previously stored array and A denote the new array.

At block 301, the read/write control module 106 may read the m×n memory array A".

At block 302, for i=1 to m, and for j=1 to n, if $A_{i,j}<A''_{i,j}$, the read/write control module 106 may store $A_{i,j}$ in the resistive memory device 102 at location (i, j), overwriting $A''_{i,j}$.

At block 303, for i=1 to m, and for j=1 to n, if $A_{i,j}>A''_{i,j}$, the read/write control module 106 may store $A_{i,j}$ in the resistive memory device 102 at location (i, j), overwriting $A''_{i,j}$.

An example of overwriting of the m×n memory array 101 is described with reference to FIGS. 1, 4 and 5A-5E.

Figures 5C, 5D:
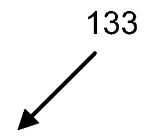
Figure 5E:
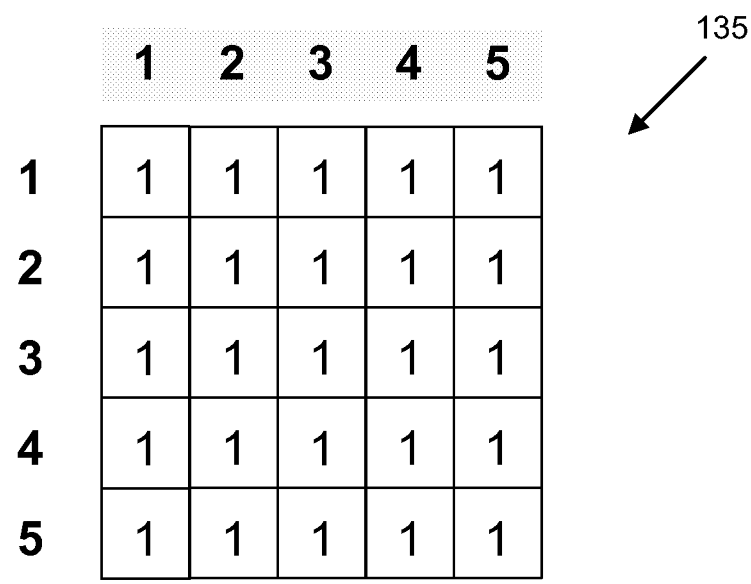

Referring to FIGS. 4 and 5A, at block 301, the read/write control module 106 may read the previously stored m×n memory array A". As shown in FIGS. 5A and 5B, the memory array 101 is shown in an initial state at 131 and a target state at 132. For the memory array 101 shown in the initial state at 131, it can be seen that all rows and columns meet the constraints (1) and (2) specified above (i.e., the sum of the entries of each of the rows and columns is less than or equal to 7.0). Referring to FIG. 5C, if the memory array 101 at 131 is written without reading the stored array (i.e., array 131) and is written in a raster scan manner, then after the first write (i.e., $A_{1,1}$) the intermediate array would look as shown in FIG. 5C at 133. For the array at 133, it can be seen that constraint violations occur in row 1 and also column 1, in that the sum of the entries of row 1 and column 1 are each 8.0. At block 302, for i=1 to m, and for j=1 to n, if $A_{i,j}<A''_{i,j}$, the read/write control module 106 may store $A_{i,j}$ in the resistive memory device 102 at location (i, j), overwriting $A''_{i,j}$. For example, $A_{1,4}=1$ (see FIG. 5B), and $A''_{1,4}=3$ (see FIG. 5A). Therefore, since $A_{1,4}<A''_{1,4}$, the read/write control module 106 may store $A_{1,4}$ in the resistive memory device 102 at location (1, 4), overwriting $A''_{1,4}$. With all entries per block 302 evaluated and written, the resulting array is shown in FIG. 5D at 134. At block 303, for i=1 to m, and for j=1 to n, if $A_{i,j}>A''_{i,j}$, the read/write control module 106 may store $A_{i,j}$ in the resistive memory device 102 at location (i, j), overwriting $A''_{i,j}$. For example, $A_{1,1}=1$ (see FIG. 5B), and $A''_{1,1}=0$ (see FIG. 5A). Therefore, since $A_{1,1}>A''_{1,1}$, the read/write control module 106 may store $A_{1,1}$ in the resistive memory device 102 at location (1, 1), overwriting $A''_{1,1}$. With all entries per block 303 evaluated and written, the resulting array is shown in FIG. 5E at 135.

3. Computer Readable Medium

Figure 6:
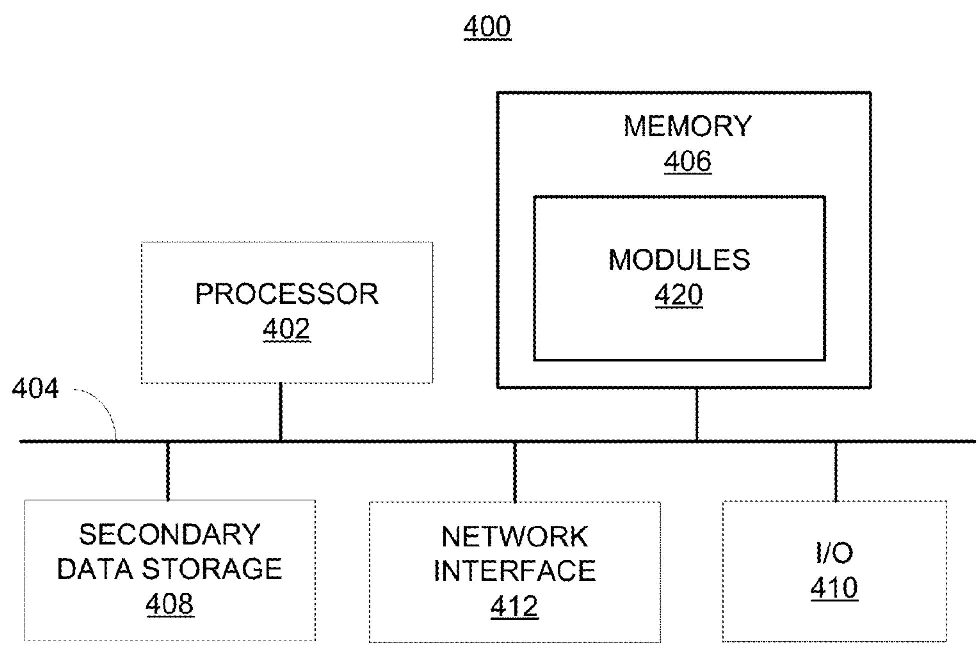
FIG. 6 illustrates a computer system, according to an embodiment.

FIG. 6 shows a computer system 400 that may be used with the embodiments described herein. The computer system 400 represents a generic platform that includes components that may be in a server or another computer system. The computer system 400 may be used as a platform for the system 100. The computer system 400 may execute, by a processor or other hardware processing circuit, the methods, functions and other processes described herein. These methods, functions and other processes may be embodied as machine readable instructions stored on computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 400 includes a processor 402 that may implement or execute machine readable instructions performing some or all of the methods, functions and other processes described herein. Commands and data from the processor 402 are communicated over a communication bus 404. The computer system 400 also includes a main memory 406, such as a random access memory (RAM), where the machine readable instructions and data for the processor 402 may reside during runtime, and a secondary data storage 408, which may be non-volatile and stores machine readable instructions and data. The secondary data storage 408 may be the same as or similar to the system 100. The memory and data storage are examples of computer readable mediums. The memory 406 may include modules 420 including machine readable instructions residing in the memory 406 during runtime and executed by the processor 402. The modules 420 may include the modules 103-106 of the system 100 shown in FIG. 1.

The computer system 400 may include an I/O device 410, such as a keyboard, a mouse, a display, etc. The computer system 400 may include a network interface 412 for connecting to a network. Other known electronic components may be added or substituted in the computer system 400.

While the embodiments have been described with reference to examples, various modifications to the described embodiments may be made without departing from the scope of the claimed embodiments.

What is claimed is:

1. A data storage system comprising:

a memory array including a plurality of memory devices programmable in greater than two states; and a read/write control module, executed by a processor, to overwrite data in the memory array without violating a constraint during the overwrite process, and to determine if a target entry, which is a data value to be written to a selected memory device in the memory array, is less than a corresponding initial entry, which is a data value currently stored in the selected memory device in the memory array, and based on the determination, the read/write control module is to overwrite data in the selected memory device.

2. The data storage system of claim 1, wherein the memory devices are programmable in greater than two resistance states.

3. The data storage system of claim 1, wherein the memory devices are programmable in greater than two states associated with a physical magnitude of a memory device.

4. The data storage system of claim 1, wherein the memory array is an m×n memory array.

5. The data storage system of claim 4, wherein the constraint includes a set of constraints that are specified such that an amount of current leaking through half-selected memory devices in a selected row and a selected column of the m×n memory array is, respectively, less than or equal to nC/2 and mC/2, where C is the largest sum of half-selected device current magnitudes for pairs of complementary states of a half-selected device among a set of possible pairs of complementary states.

6. The data storage system of claim 4, wherein for i=1 to m, and for j=1 to n, the read/write control module is to determine if $A_{i,j}<A''_{i,j}$, and based on the determination, the read/write control module is to store a resistance state corresponding to $A_{i,j}$ in a respective memory device at location (i, j), overwriting a resistance state corresponding to $A''_{i,j}$, where $A_{i,j}$ and $A''_{i,j}$ respectively denote data values corresponding to target and initial resistance states at position (i, j) of the m×n memory array.

7. The data storage system of claim 6, wherein for i=1 to m, and for j=1 to n, the read/write control module is to determine if $A_{i,j}>A''_{i,j}$, and based on the determination, the read/write control module is to store the resistance state corresponding to $A_{i,j}$ in the respective memory device at location (i, j), overwriting the resistance state corresponding to $A''_{i,j}$.

8. The data storage system of claim 4, wherein for i=1 to m, and for j=1 to n, the read/write control module is to determine if $A_{i,j}>A''_{i,j}$, and based on the determination, the read/write control module is to store a resistance state corresponding to $A_{i,j}$ in a respective memory device at location (i, j), overwriting a resistance state corresponding to $A''_{i,j}$, where $A_{i,j}$ and $A''_{i,j}$ respectively denote data values corresponding to target and initial resistance states at position (i, j) of the m×n memory array.

9. The data storage system of claim 1, wherein the read/write control module is to determine if the target entry in the memory array is greater than the corresponding initial entry in the memory array, and based on the determination, the read/write control module is to overwrite data in the selected memory device.

10. A method for overwriting a m×n memory array including a plurality of memory devices, the method comprising:

programming the memory devices in greater than two states; and overwriting, by a processor, data in the memory array without violating a constraint during the overwrite process, wherein the constraint includes a set of constraints that are specified such that an amount of current leaking through half-selected memory devices in a selected row and a selected column of the m×n memory array is, respectively, less than or equal to nC/2 and mC/2, where C is the largest sum of half-selected device current magnitudes for pairs of complementary states of a half-selected device among a set of possible pairs of complementary states.

11. The method of claim 10, wherein the memory devices are programmable in greater than two resistance states.

12. The method of claim 10, wherein the memory devices are programmable in greater than two states associated with a physical magnitude of a memory device.

13. The method of claim 10, further comprising determining if a target entry, which is a data value to be written to a selected memory device in the memory array, is less than a corresponding initial entry, which is a data value currently stored in the selected memory device in the memory array, and based on the determination, overwriting data in the selected memory device.

14. The method of claim 13, further comprising determining if the target entry is greater than the corresponding initial entry, and based on the determination, overwriting data in the selected memory device.

15. The method of claim 10, wherein for i=1 to m, and for j=1 to n, the method further comprising determining if $A_{i,j}<A''_{i,j}$, and based on the determination, storing a resistance state corresponding to $A_{i,j}$ in a respective memory device at location (i, j), overwriting a resistance state corresponding to $A''_{i,j}$, where $A_{i,j}$ and $A'_{i,j}$ respectively denote data values corresponding to target and initial resistance states at position (i, j) of the m×n memory array.

16. The method of claim 10, wherein for i=1 to m, and for j=1 to n, the method further comprising determining if $A_{i,j}>A''_{i,j}$, and based on the determination, storing a resistance state corresponding to $A_{i,j}$ in a respective memory device at location (i, j), overwriting a resistance state corresponding to $A''_{i,j}$, where $A_{i,j}$ and $A''_{i,j}$ respectively denote target and initial resistance states at position (i, j) of the m×n memory array.

17. A non-transitory computer readable medium storing machine readable instructions, that when executed by a computer system, perform a method for overwriting a m×n memory array including a plurality of memory devices, the method comprising:

programming the memory devices in greater than two states;

overwriting, by a processor, data in the memory array without violating a constraint during the overwrite process; and for i=1 to m, and for j=1 to n, determining if $A_{i,j}<A''_{i,j}$, and based on the determination, storing a resistance state corresponding to $A_{i,j}$ in a respective memory device at location (i, j), overwriting a resistance state corresponding to $A''_{i,j}$, where $A_{i,j}$ and $A''_{i,j}$ respectively denote data values corresponding to target and initial resistance states at position (i, j) of the m×n memory array.

18. The non-transitory computer readable medium of claim 17, the method further comprises:

for i=1 to m, and for j=1 to n, determining if $A_{i,j}>A''_{i,j}$, and based on the determination, storing the resistance state corresponding to $A_{i,j}$ in a respective memory device at location (i, j), overwriting the resistance state corresponding to $A''_{i,j}$.

19. The non-transitory computer readable medium of claim 17, wherein the constraint includes a set of constraints that are specified such that an amount of current leaking through half-selected memory devices in a selected row and a selected column of the m×n memory array is, respectively, less than or equal to nC/2 and mC/2, where C is the largest sum of half-selected device current magnitudes for pairs of complementary states of a half-selected device among a set of possible pairs of complementary states.

* * * * *

UNITED STATES PATENT AND TRADEMARK OFFICE

CERTIFICATE OF CORRECTION

PATENT NO. : 8,537,596 B2
APPLICATION NO. : 13/278882
DATED : September 17, 2013
INVENTOR(S) : Erik Ordentlich et al.

It is certified that error appears in the above-identified patent and that said Letters Patent is hereby corrected as shown below:

In the Claims:

In column 12, line 1, in Claim 15, delete "$A'_{i,j}$" and insert -- $A''_{i,j}$ --, therefor.

Signed and Sealed this
Eighteenth Day of February, 2014

Michelle K. Lee
*Deputy Director of the United States Patent and Trademark Office*